United States Patent
Makinouchi

(10) Patent No.: US 8,760,622 B2
(45) Date of Patent: Jun. 24, 2014

(54) MOVABLE BODY APPARATUS, EXPOSURE APPARATUS AND PATTERN FORMATION APPARATUS, AND DEVICE MANUFACTURING METHOD

(75) Inventor: Susumu Makinouchi, Zuma (JP)

(73) Assignee: Nikon Corporation, Tokyo (JP)

( * ) Notice: Subject to any disclaimer, the term of this patent is extended or adjusted under 35 U.S.C. 154(b) by 1188 days.

(21) Appl. No.: 12/331,588

(22) Filed: Dec. 10, 2008

(65) Prior Publication Data

US 2009/0273767 A1 Nov. 5, 2009

Related U.S. Application Data

(60) Provisional application No. 61/006,862, filed on Feb. 4, 2008.

(30) Foreign Application Priority Data

Dec. 11, 2007 (JP) ................................. 2007-320050

(51) Int. Cl.
| | | |
|---|---|---|
| G03B 27/42 | (2006.01) | |
| G03B 27/58 | (2006.01) | |
| G03B 27/62 | (2006.01) | |
| G03B 27/52 | (2006.01) | |
| G03B 27/54 | (2006.01) | |
| G03B 27/32 | (2006.01) | |

(52) U.S. Cl.
USPC .................. 355/53; 355/55; 355/67; 355/72; 355/75; 355/77

(58) Field of Classification Search
CPC .............. G03F 7/7085; G03F 7/70691; G03F 7/70733; G03F 9/7049
USPC .............................. 355/52, 53, 55, 67–77, 30; 356/399–401; 250/492.1, 492.2, 250/492.22
See application file for complete search history.

(56) References Cited

U.S. PATENT DOCUMENTS

| | | | |
|---|---|---|---|
| 4,984,891 A | | 1/1991 | Miyazaki et al. |
| 5,079,418 A | * | 1/1992 | Michel et al. ............. 250/237 G |
| 5,448,358 A | * | 9/1995 | Ishizuka et al. ............... 356/619 |

(Continued)

FOREIGN PATENT DOCUMENTS

| | | |
|---|---|---|
| EP | 1 420 298 A2 | 5/2004 |
| JP | A-63-231217 | 9/1988 |

(Continued)

OTHER PUBLICATIONS

Mar. 10, 2009 Written Opinion issued in Application No. PCT/JP2008/003693 (with English translation).

(Continued)

Primary Examiner — Toan Ton
Assistant Examiner — Christina Riddle
(74) Attorney, Agent, or Firm — Oliff PLC

(57) ABSTRACT

A movable body apparatus is equipped with a Y measuring system equipped with an encoder and an interferometer that measure the position of a stage in one axis (Y-axis) direction. The interferometer irradiates a reflection surface arranged on the stage with a measurement light close to a measurement light of the encoder, and receives its reflected light. In this case, the encoder and the interferometer commonly use an optical member fixed to the stage. Accordingly, the Y interferometer and the Y encoder have substantially the equal measurement axis.

45 Claims, 6 Drawing Sheets

(56) References Cited

U.S. PATENT DOCUMENTS

| | | |
|---|---|---|
| 5,493,403 A | 2/1996 | Nishi |
| 5,579,111 A | 11/1996 | Maeda |
| 5,666,196 A * | 9/1997 | Ishii et al. ............... 356/499 |
| 5,969,411 A | 10/1999 | Fukaya |
| 5,969,441 A | 10/1999 | Loopstra et al. |
| 6,208,407 B1 | 3/2001 | Loopstra |
| 6,590,634 B1 | 7/2003 | Nishi et al. |
| 6,611,316 B2 | 8/2003 | Sewell |
| 6,778,257 B2 | 8/2004 | Bleeker et al. |
| 6,952,253 B2 | 10/2005 | Lof et al. |
| 7,023,610 B2 | 4/2006 | Ohtsuki et al. |
| 7,102,729 B2 | 9/2006 | Renkens et al. |
| 7,256,871 B2 | 8/2007 | Loopstra et al. |
| 7,289,212 B2 | 10/2007 | Kwan |
| 7,292,312 B2 | 11/2007 | Loopstra et al. |
| 7,333,174 B2 | 2/2008 | Koenen et al. |
| 7,362,446 B2 | 4/2008 | Van Der Pasch et al. |
| 2003/0025890 A1 | 2/2003 | Nishinaga |
| 2005/0111005 A1* | 5/2005 | Eussen et al. ............... 356/498 |
| 2005/0128461 A1* | 6/2005 | Beems et al. ............... 355/72 |
| 2006/0023178 A1* | 2/2006 | Loopstra et al. ............... 355/53 |
| 2007/0058172 A1* | 3/2007 | Van Der Pasch et al. ..... 356/494 |
| 2007/0223007 A1* | 9/2007 | Klaver et al. ............... 356/499 |
| 2007/0263191 A1 | 11/2007 | Shibazaki |
| 2007/0263197 A1 | 11/2007 | Luttikhuis et al. |
| 2007/0288121 A1 | 12/2007 | Shibazaki |
| 2008/0074681 A1 | 3/2008 | Loopstra et al. |

FOREIGN PATENT DOCUMENTS

| | | |
|---|---|---|
| JP | A-02-001501 | 1/1990 |
| JP | A-2-1501 | 1/1990 |
| JP | A-10-38517 | 2/1998 |
| JP | A-2001-185474 | 7/2001 |
| JP | A-2004-101362 | 4/2004 |
| JP | A-2004-289126 | 10/2004 |
| JP | A-2006-266864 | 10/2006 |
| JP | A-2007-292735 | 11/2007 |
| WO | WO 99/49504 A1 | 9/1999 |
| WO | WO 01/35168 A1 | 5/2001 |
| WO | WO 2004/055803 A1 | 7/2004 |
| WO | WO 2005/074014 A1 | 8/2005 |
| WO | WO 2007/034379 A2 | 3/2007 |
| WO | WO 2007/083758 A1 | 7/2007 |
| WO | WO 2007/097380 A1 | 8/2007 |

OTHER PUBLICATIONS

May 17, 2012 Office Action issued in Chinese Application No. 200880018712.9 (with English translation).

* cited by examiner

MOVABLE BODY APPARATUS, EXPOSURE APPARATUS AND PATTERN FORMATION APPARATUS, AND DEVICE MANUFACTURING METHOD

CROSS-REFERENCE TO RELATED APPLICATIONS

This non-provisional application claims the benefit of Provisional Application No. 61/006,862 filed Feb. 4, 2008, the disclosure of which is hereby incorporated herein by reference in its entirety.

BACKGROUND OF THE INVENTION

1. Field of the Invention

The present invention relates to movable body apparatuses, exposure apparatuses and pattern formation apparatuses, and device manufacturing methods, and more particularly to a movable body apparatus equipped with a movable body that moves in at least one axial direction along a predetermined plane, an exposure apparatus and a pattern formation apparatus equipped with the movable body apparatus, and a device manufacturing method that uses the exposure apparatus or the pattern formation apparatus.

2. Description of the Background Art

Conventionally, when manufacturing electron devices (microdevices) such as semiconductor devices (integrated circuits and the like) and liquid crystal display devices, an exposure apparatus such as a reduction projection exposure apparatus by a step-and-repeat method (a so-called stepper) or a reduction projection exposure apparatus by a step-and-scan method (a so-called scanning stepper (which is also called a scanner)) is relatively frequently used in a lithography process.

In this type of exposure apparatuses, in order to transfer a pattern of a reticle (or a mask) to a plurality of shot areas on a substrate such as a wafer or a glass plate (hereinafter, generally referred to as a "wafer"), a wafer stage that holds the wafer is driven in two-dimensional directions by, for example, a linear motor or the like. In particular, in the case of the scanning stepper, not only the wafer stage but also a reticle stage is driven with a predetermined stroke in a scanning direction by a linear motor or the like.

Conventionally, a laser interferometer was used for position measurement of the stage in general, and besides the laser interferometer, an encoder was also used. When the encoder is used for position measurement of the stage, the apparatus-specific measurement errors tend to occur due to scale-specific manufacturing errors, and errors caused by attachment of a scale (including deformation occurred when attaching the scale, and the like). Meanwhile, the laser interferometer can generally obtain an absolute length that does not depend on the apparatus because it uses a physical quantity, which is a wavelength of light, but at the same time, since the laser interferometer has measurement errors due to air fluctuations generated by influence of temperature variation and/or temperature gradient in an atmosphere in a beam path of the laser interferometer, the stage positioning precision is degraded. Therefore, in conventional methods, a stage device that complementarily uses the encoder and the laser interferometer has been proposed (e.g. refer to Kokai (Japanese Unexamined Patent Application Publication) No. 2004-101362).

As a method of using the encoder and the laser interferometer in a complementary manner, which is the most realistic (practical) method, a method can be cited in which by driving a stage at an extremely low speed and spending sufficient time to perform measurement, measurement values of the interferometer are made to be reliable, and a calibration table of encoder measurement values is created using the measurement values of the interferometer, and when performing actual exposure, the exposure is performed using only the encoder measurement values and the calibration table.

However, with the encoder described in Kokai (Japanese Unexamined Patent Application Publication) No. 2004-101362, and the like, a linear scale needed to be installed at a position that was far away from a wafer mounting position on a wafer stage (from a position to which an exposure light is actually irradiated), and therefore the measurement points of the encoder and the interferometer were away from each other, and hence it was difficult to obtain accurate measurement values due to being affected by the Abbe error caused by a rotational motion of the wafer stage, local deformation of the stage, and the like.

SUMMARY OF THE INVENTION

The present invention has been made under the circumstances described above, and according to a first aspect of the present invention, there is provided a first movable body apparatus, comprising: a movable body that moves in at least one axial direction along a predetermined plane; a first measurement device that includes a moving grating which is arranged on the movable body and to which a first measurement light is irradiated along an optical path at least partially including a first optical path in the one axial direction, a fixed grating which is arranged outside the movable body and has a periodic direction in the one axial direction and to which a diffracted light generated at the moving grating is irradiated, and a photodetection system which receives a diffracted light from the fixed grating via the moving grating, and that measures positional information of the movable body in the one axial direction; and a second measurement device that measures positional information of the movable body in the one axial direction, by irradiating a reflection surface arranged on the movable body with a second measurement light along a second optical path in the one axial direction, which is close to or overlaps with the first optical path, and receiving a reflected light from the reflection surface.

With this apparatus, since the measurement axes of the first and second measurement devices coincide with or are close to each other, positional information of the movable body in the one axial direction that is measured by the first and second measurement devices hardly includes measurement errors caused by rotation or local deformation of the movable body, or the like. Accordingly, for example, when the movable body is driven at an extremely low speed and positional information of the movable body is measured using the first and second measurement devices during the driving, the second measurement light is hardly affected by air fluctuations, and therefore reliability of measurement values of the second measurement device is improved. And, by creating calibration information of measurement values of the first measurement device using the measurement values of the second measurement device, the calibration information with high precision can be created.

According to a second aspect of the present invention, there is provided a second movable body apparatus, comprising: a movable body that moves in at least one axial direction along a predetermined plane; a first measurement device that measures positional information of the movable body in the one axial direction, by irradiating a fixed grating, which is arranged outside the movable body and has a periodic direction in the one axial direction, with a first measurement light along an optical path at least partially including a first optical path in the one axial direction, via a part of the movable body, and receiving a diffracted light from the fixed grating via the part of the movable body; and a second measurement device that measures positional information of the movable body in the one axial direction, by irradiating the part of the movable body with a second measurement light along a second optical path in the one axial direction and receiving a return light of the second measurement light from the movable body, wherein the first and second measurement devices each include a common optical member that constitutes the part of the movable body.

With this apparatus, since the first and second measurement devices each include the common optical member that constitutes a part of the movable body, the optical path of the first measurement light sent to the movable body and the optical path of the second measurement light sent to the movable body can be made coincident or close. Accordingly, positional information of the movable body in the one axial direction that is measured by the first and second measurement devices hardly includes measurement errors caused by rotation or local deformation of the movable body, or the like. Further, the number of components can be reduced, compared with the case where the first measurement device and the second measurement device are completely separately arranged.

According to a third aspect of the present invention, there is provided a third movable body apparatus, comprising: a movable body that moves in at least one axial direction along a predetermined plane; a first measurement device that measures positional information of the movable body in the one axial direction, by irradiating a first grating of the movable body or a first grating arranged outside the movable body via a part of the movable body, with a first measurement light along an optical path including a first optical path in the one axial direction that is headed to the movable body via an optical system, and receiving a diffracted light from the first grating; and a second measurement device that measures positional information of the movable body in the one axial direction, by irradiating the movable body with a second measurement light via at least a part of an optical member of the optical system, along a second optical path parallel to the first optical path and receiving a return light of the second measurement light from the movable body.

With this apparatus, the first measurement light and the second measurement light are sent to the movable body along the first optical path and the second optical path in the one axial direction, respectively, via at least a part of the optical member (the common optical member) that constitutes the optical system. Accordingly, it becomes possible to make the first optical path and the second optical path coincident or close. Accordingly, positional information of the movable body in the one axial direction that is measured by the first and second measurement devices hardly includes measurement errors caused by rotation or local deformation of the movable body, or the like. Further, the number of components can be reduced, compared with the case where the first measurement device and the second measurement device are completely separately arranged.

According to a fourth aspect of the present invention, there is provided an exposure apparatus that forms a pattern on an object by irradiating the object with an energy beam, the apparatus comprising: any one of the first to third movable body apparatuses of the present invention, which drives a movable body that holds the object along a predetermined plane, in order to form the pattern.

With this apparatus, the movable body that holds an object is driven along a predetermined plane by any one of the first to third movable body apparatuses of the present invention, in order to form a pattern on the object by irradiating the object with an energy beam. Accordingly, it becomes possible to form the pattern on the object with high precision.

According to a fifth aspect of the present invention, there is provided a pattern formation apparatus that forms a pattern on an object, the apparatus comprising: a movable body that is movable holding the object; a pattern generating device that forms a pattern on the object; and any one of the first to third movable body apparatuses of the present invention, which drives the movable body within a predetermined plane.

With this apparatus, the movable body that holds an object is driven along a predetermined plane by any one of the first to third movable body apparatuses of the present invention, in order to form a pattern on the object. Accordingly, it becomes possible to form the pattern on the object with high precision.

According to a sixth aspect of the present invention, there is provided a first device manufacturing method, comprising: a process of forming a pattern on an object using the exposure apparatus of the present invention; and a process of applying processing to the object on which the pattern has been formed.

According to a seventh aspect of the present invention, there is provided a second device manufacturing method, comprising: a process of forming a pattern on an object using the pattern formation apparatus of the present invention; and a process of applying processing to the object on which the pattern has been formed.

BRIEF DESCRIPTION OF THE DRAWINGS

In the accompanying drawings;

FIGS. 5A and 5B are views used to explain a configuration of a position measuring system which an exposure apparatus of a second embodiment is equipped with.

DESCRIPTION OF THE EMBODIMENTS

First Embodiment

A first embodiment of the present invention will be described below, with reference to FIGS. 1 to 3.

Figure 1:
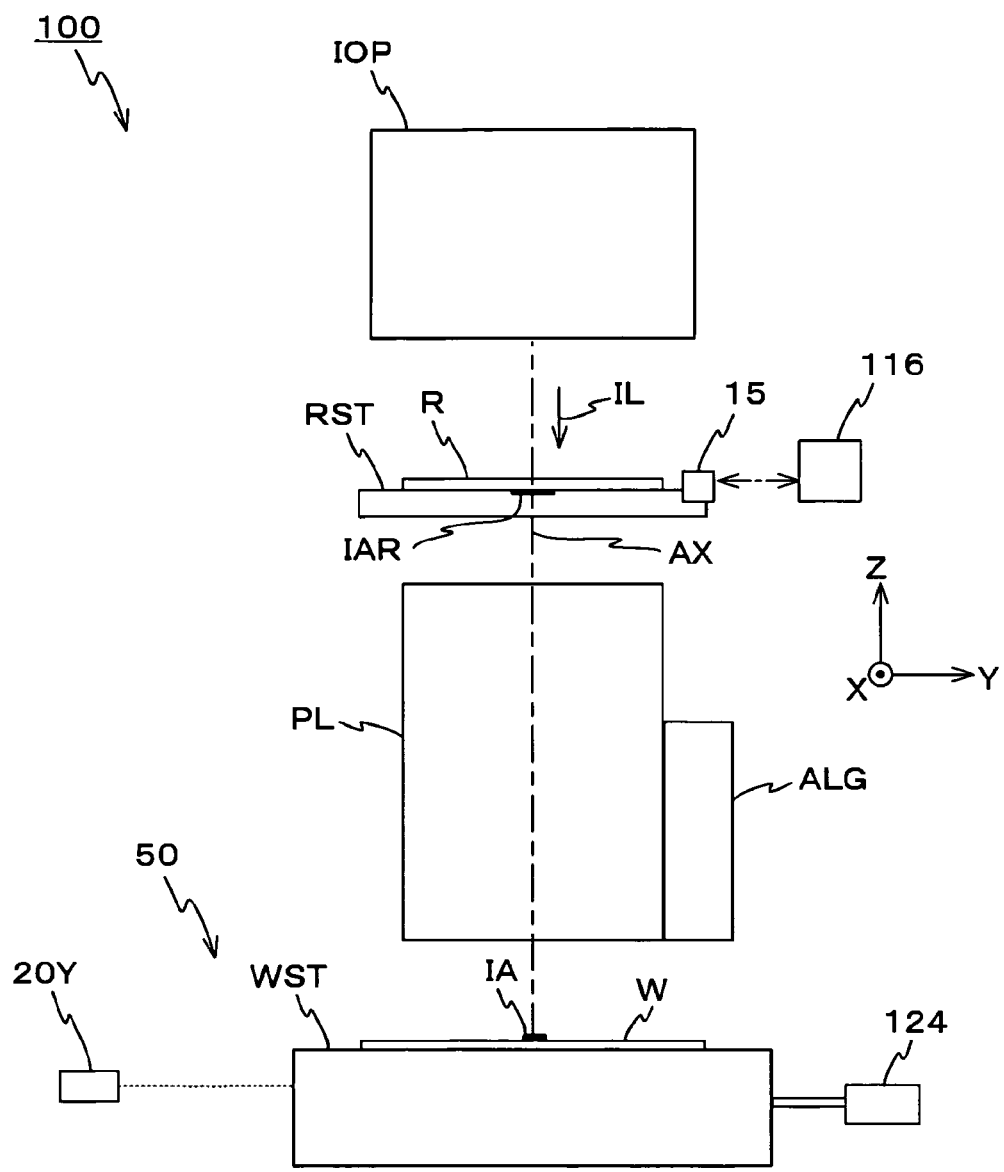
FIG. 1 is a view schematically showing a configuration of an exposure apparatus related to a first embodiment.

FIG. 1 schematically shows a configuration of an exposure apparatus 100 of the first embodiment. Exposure apparatus 100 is a projection exposure apparatus by a step-and-scan method, which is a so-called scanner. As is described later, a projection optical system PL is arranged in this embodiment, and in the description below, the explanation is given assuming that a direction parallel to an optical axis AX of projection optical system PL is a Z-axis direction, a direction in which a reticle R and a wafer W are relatively scanned for exposure within a plane orthogonal to the Z-axis direction is a Y-axis direction, and a direction that is orthogonal to a Z-axis and a Y-axis is an X-axis direction, and rotation (inclination) directions about an X-axis, the Y-axis and the Z-axis are θx, θy and θz directions, respectively.

Exposure apparatus 100 is equipped with an illumination unit IOP, a reticle stage RST, projection optical system PL, a stage device 150 including a wafer stage WST that moves two-dimensionally within an XY plane, holding wafer W, and their control system, and the like.

As is disclosed in, for example, U.S. Patent Application Publication No. 2003/0025890 and the like, Illumination unit IOP includes: a light source; and an illumination optical system that has an illuminance uniformity optical system containing an optical integrator and the like, and a reticle blind and the like (none of which are shown). Illumination unit IOP illuminates a slit-shaped illumination area IAR, which is defined by the reticle blind (a masking system), on reticle R with an illumination light (exposure light) IL with uniform illuminance. In this case, as illumination light IL, an ArF excimer laser light (wavelength: 193 nm) is used, as an example.

On reticle stage RST, reticle R having a pattern surface (a lower surface in FIG. 1) on which a circuit pattern and the like are formed is fixed by, for example, vacuum suction. Reticle stage RST is finely drivable within the XY plane and also drivable at a designated scanning speed in a scanning direction (which is the Y-axis direction being a lateral direction of the page surface of FIG. 1), with a reticle stage drive system 11 (not shown in FIG. 1, refer to FIG. 3) including, for example, a linear motor or the like.

Positional information of reticle stage RST within the XY plane (including rotational information in the θz direction) is constantly detected at a resolution of, for example, around 0.25 nm with a reticle laser interferometer (hereinafter, referred to as a "reticle interferometer") 116 via a movable mirror 15 (in actuality, a Y movable mirror (or a retroreflector) having a reflection surface orthogonal to the Y-axis direction and an X movable mirror having a reflection surface orthogonal to the X-axis direction are arranged). Measurement information of reticle interferometer 116 is sent to a controller 50 (not shown in FIG. 1, refer to FIG. 3).

As projection optical system PL, for example, a dioptric system that is composed of a plurality of lenses (lens elements) that share optical axis AX in the Z-axis direction is used. Projection optical system PL is, for example, both-side telecentric and has a predetermined projection magnification (e.g. one-quarter, or one-fifth). Therefore, when illumination area IAR on reticle R is illuminated by illumination light IL from illumination unit IOP, illumination light IL having passed through reticle R whose pattern surface is placed almost coincident with a first plane (an object plane) of projection optical system PL forms a reduced image of a circuit pattern (a reduced image of a part of a circuit pattern) of reticle R within illumination area IAR on an area (hereinafter, also referred to as an "exposure area") IA that is conjugate to illumination area IAR on wafer W, which is placed on a second plane (an image plane) side of projection optical system PL and whose surface is coated with a resist (a sensitive agent), via projection optical system PL (projection unit PU). Then, by moving reticle R in the scanning direction (the Y-axis direction) relative to illumination area IAR (illumination light IL) and also moving wafer W in the scanning direction (the Y-axis direction) relative to the exposure area (illumination light IL) by synchronous drive of reticle stage RST and wafer stage WST, scanning exposure of one shot area (divided area) on wafer W is performed, and a pattern of reticle R is transferred to the shot area. More specifically, in this embodiment, a pattern is generated on wafer W by illumination unit IOP, reticle R and projection optical system PL, and the pattern is formed on wafer W due to exposure of a sensitive layer (resist layer) on wafer W with illumination light IL.

In the vicinity of projection optical system PL, an alignment system ALG by an off-axis method is arranged. As alignment system ALG, for example, a sensor by an image processing method can be used, and the sensor by an image processing method is disclosed in, for example, U.S. Pat. No. 5,493,403 and the like. The detection results obtained by alignment system ALG are sent to controller 50.

Stage device 150 is equipped with wafer stage WST that holds wafer W via a wafer holder (not shown), a wafer stage drive system 124 that drives wafer stage WST, and the like. Wafer stage WST is placed below projection optical system PL in FIG. 1, and is supported above a base (not shown) in a noncontact manner by a static gas bearing, for example, an air bearing arranged on a bottom surface of the wafer stage. Wafer stage WST is driven with a predetermined stroke in the X-axis direction and the Y-axis direction by wafer stage drive system 124 including, for example, a linear motor, a voice coil motor and the like, and also finely driven in the Z-axis direction orthogonal to the XY plane, and in the rotational directions, i.e. the θx direction, the θy direction and the θz direction.

Incidentally, in this embodiment, as is described above, wafer stage WST is to be a single stage that is drivable in directions of six degrees of freedom, but wafer stage WST is not limited thereto, and wafer stage WST can also be configured of an XY stage that is freely movable within the XY plane and a table that is driven in directions of three degrees of freedom which are the Z, θx and θy directions on the XY stage.

Positional information of wafer stage WST is constantly detected by position measuring system 200 (refer to FIG. 3) and sent to controller 50. Position measuring system 200 is equipped with a Y measuring system 20Y (refer to FIG. 1) and an X measuring system 20X.

Figure 2A:
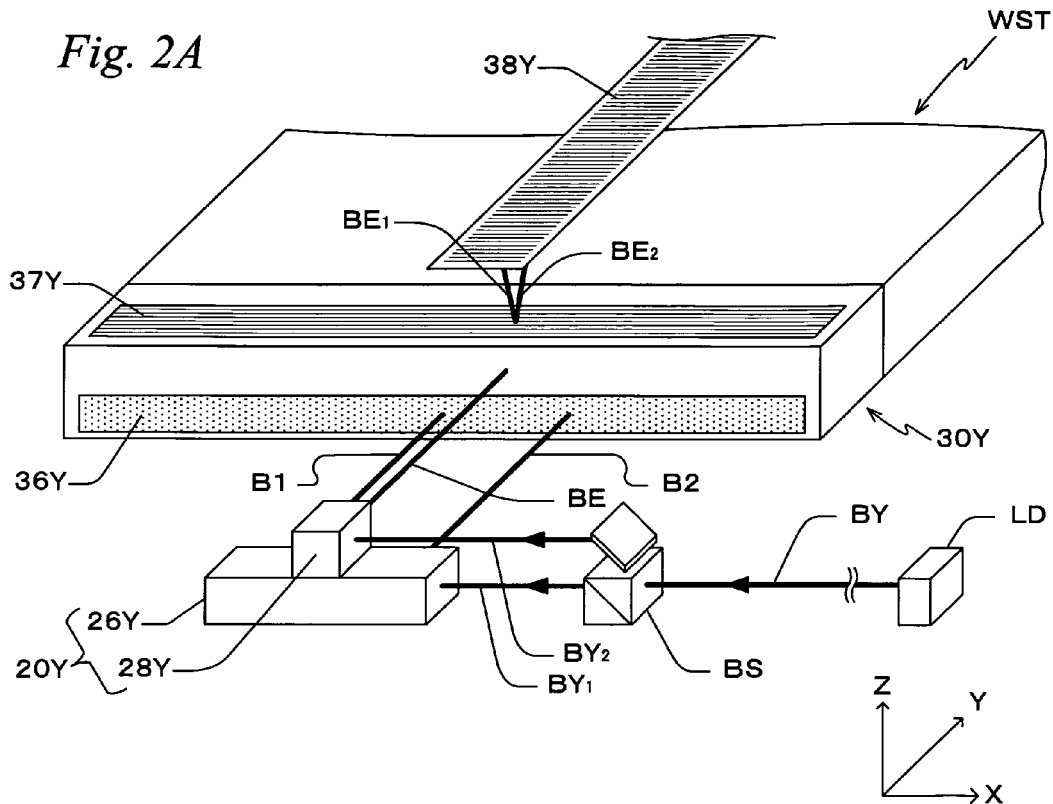
FIGS. 2A and 2B are views used to explain a Y measuring system shown in FIG. 1.

As shown in FIG. 2A, Y measuring system 20Y includes a Y encoder unit 28Y and a Y interferometer unit 26Y to which a laser light BY from a light source LD enters, respectively, after being split by a beam splitter BS.

Light source LD emits a coherent light, e.g. a laser light (hereinafter, shortly referred to as a light, as needed) BY having a wavelength λ (=850 nm) along a predetermined optical path, e.g. an optical path parallel to the X-axis. Light BY is split by beam splitter BS into two lights, i.e. a light $BY_1$ and a light $BY_2$. Two lights $BY_1$ and $BY_2$ are respectively supplied to Y interferometer unit (hereinafter, shortly referred to as Y interferometer, as needed) 26Y and Y encoder unit (hereinafter, shortly referred to as Y encoder, as needed) 28Y.

As Y interferometer 26Y, in this embodiment, an interferometer by a double-path method having two measurement paths is used. In FIG. 2A, a reference sign B1 denotes a measurement beam (a measurement light) that passes through a first measurement path parallel to the Y-axis and a reference sign B2 denotes a measurement light that passes through a second measurement path parallel to the Y-axis, respectively. With Y interferometer 26Y, measurement light B1 passes through the first measurement path and is irradiated perpendicularly to a reflection surface 36Y arranged on wafer stage WST and parallel to the XZ plane, and then the optical path of a reflected light of this measurement light B1 is made to return due to a corner cube inside Y interferometer 26Y, and the reflected light becomes a measurement light B2 that passes through the second measurement path and is irradiated perpendicularly to reflection surface 36Y again. Then, a reflected light of this measurement light B2 is coaxially synthesized with a reference light generated inside Y interferometer 26Y and enters a detector. The intensity of the synthesized light received by the detector is measured by a measurement unit (not shown) which Y interferometer 26Y is equipped with.

The intensity of the synthesized light varies sinusoidally with a relative displacement in the Y-axis direction between Y interferometer unit 26Y and reflection surface 36Y. Therefore, Y interferometer unit 26Y obtains the relative displacement from the intensity variation of the synthesized light.

Information on the relative displacement (measurement result) is transmitted to controller 50. From the measurement result that has been received, controller 50 computes a displacement of wafer stage WST from a reference position in the Y-axis direction, i.e. a position in the Y-axis direction (Y-position).

As Y encoder 28Y, in this embodiment, an encoder by a diffraction interference method is used. An optical path of a light $BY_2$ supplied to Y encoder 28Y is deflected to the +Y direction by a deflection mirror (not shown) inside a housing of Y encoder 28Y, and light $BY_2$ is sent toward wafer stage WST as a measurement light (a measurement beam) BE.

The optical path of measurement light BE coincides with an axis that is orthogonal to optical axis AX of projection optical system PL and is parallel to the Y-axis. More specifically, a measurement axis of Y encoder 28Y passes through optical axis AX of projection optical system PL.

Optical paths (the first measurement path, the second measurement path) of two measurement lights B1 and B2 of Y interferometer 26Y described earlier are placed an equal distance apart in the X-axis direction in a planar view and also a predetermined distance apart in the Z-axis direction, with the optical path of measurement light BE as a reference, i.e. the measurement axis of Y encoder 28Y as a reference. More specifically, the substantial measurement axis of Y interferometer 26Y in the Y-axis direction coincides with the measurement axis of Y encoder 28Y. In this case, the spacing distance between the optical path of measurement light BE and the optical paths of measurement lights B1 and B2 in the Z-axis direction is set so as to be as short as possible.

As shown in FIG. 2A, an optical member 30Y having a quadrangular prism shape whose longitudinal direction is in the X-axis direction is integrally fixed to a side surface on the −Y side of wafer stage WST. As shown in a sectional view of FIG. 2B, optical member 30Y has a pentaprism (hereinafter, shortly referred as a prism, as needed) 32 that is arranged in a state where its two surfaces respectively constitute a part of a −Y side end surface and a part of an upper surface of optical member 30Y, and a holding member 34 that holds pentaprism 32. In this case, a surface on the +Z side of prism 32 and a surface on the +Z side of holding member 34 are flush. Similarly, a surface on the −Y side of prism 32 and a surface on the −Y side of holding member 34 are flush. In this case, at boundary surfaces between prism 32 and holding member 34, reflection surfaces 32a and 32b as shown in FIG. 2B and the like are respectively formed.

On the surface on the +Z side of prism 32, a moving grating 37Y that is composed of a transmissive type diffraction grating having a periodic direction in the Y-axis direction is arranged. The length of moving grating 37Y in the X-axis direction is substantially equal to the length of prism 32 in the X-axis direction.

A fixed grating 38Y is placed parallel to the XY plane so as to face moving grating 37Y. Fixed grating 38Y is, for example, fixed to a lower surface of a support platform (not shown) that supports projection optical system PL. In this case, fixed grating 38Y is composed of a plate, on a surface of which (a surface on the Z-side) a reflective type diffraction grating having a periodic direction in the Y-axis direction is formed and which has a longitudinal direction in the Y-axis direction. In this case, the length of fixed grating 38Y in the Y-axis direction is set so as to cover a movement stroke of wafer stage WST in the Y-axis direction.

Figure 2B:
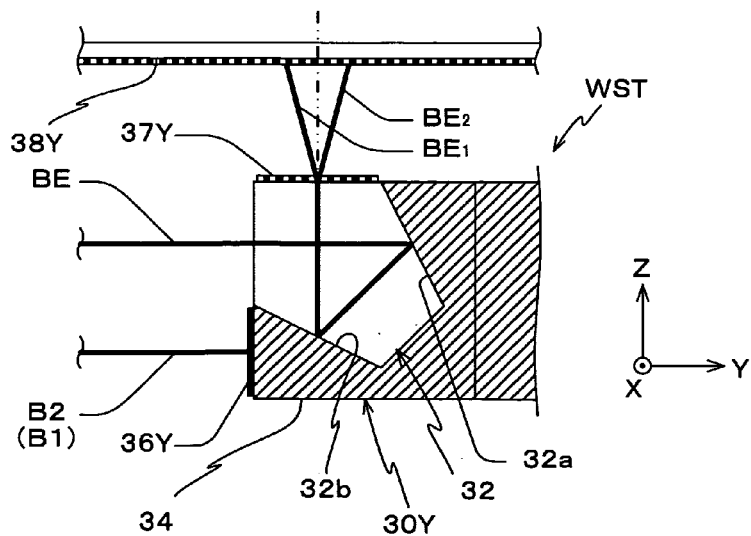

As shown in FIG. 2B, measurement light BE is irradiated perpendicularly to a surface of prism 32 on the −Y side (i.e. an upper half of a surface of optical member 30Y on the −Y side). Measurement light BE is transmitted through the surface of prism 32 on the −Y side and enters inside prism 32, and then is sequentially reflected off reflection surfaces 32a and 32b and its optical path is deflected to the +Z direction, and then measurement light BE is transmitted through the surface of prism 32 on the +Z side and is emitted to the outside. In this case, the pentaprism is a type of a constant deviation prism, and accordingly an incident light and an outgoing light constantly have a predetermined positional relation, which is an orthogonal relation in this case, regardless of the inclination of the prism. Consequently, even if prism 32 (wafer stage WST to which prism 32 is fixed) is inclined, measurement light BE incident parallel to the Y-axis is emitted parallel to the Z-axis without fail. Further, on the other hand, in the case of a light incident parallel to the Z-axis from the surface on the +Z side of prism 32, its optical path is deflected to the −Y direction sequentially via reflection surfaces 32b and 32a, and the light is transmitted through the surface on the −Y side of prism 32, and is emitted to the outside.

When measurement light BE is irradiated perpendicularly to moving grating 37Y from below (the −Z direction) via prism 32 as is described previously, a plurality of diffracted lights whose diffraction angles are different within the YZ plane are generated from moving grating 37Y. In FIGS. 2A and 2B, a +first-order diffracted light $BE_1$ and a −first-order diffracted light $BE_2$ of the plurality of lights are shown.

Diffracted lights $BE_1$ and $BE_2$ generated at moving grating 37Y are irradiated to fixed grating 38Y. Accordingly, a plurality of diffracted lights whose diffraction angles are different within the YZ plane are generated again at fixed grating 38Y. In this case, a −first-order diffracted light of +first-order diffracted light $BE_1$ generated at moving grating 37Y and a +first-order diffracted light of −first-order diffracted light $BE_2$ generated at moving grating 37Y are irradiated to moving grating 37Y along the optical paths of the original diffracted lights, respectively.

The ±first-order diffracted lights described above from fixed grating 38Y are coaxially converged (synthesized) via moving grating 37Y. The optical path of the synthesized light is deflected to the −Y direction via prism 32, and the synthesized light is received by a detector (not shown) inside the housing of Y encoder 28Y. The intensity of the synthesized light received by the detector is measured by a measurement unit (not shown).

In this case, the intensity of the synthesized light varies sinusoidally with a relative displacement in the Y-axis direction between moving grating 37Y and fixed grating 38Y, because the diffracted lights generated at fixed grating 38Y interfere with each other. Therefore, the measurement unit detects a phase difference of the diffracted lights from the intensity variation of the synthesized light, and from the phase difference, obtains the relative displacement in the Y-axis direction between moving grating 37Y and fixed grating 38Y.

Information on the relative displacement (measurement result) is transmitted to controller 50. From the received measurement result, controller 50 computes a displacement of wafer stage WST in the Y-axis direction from a reference position, i.e. a position in the Y-axis direction (Y-position) of wafer stage WST.

Y encoder 28Y does not synthesize the measurement light returned from wafer stage WST with a reference light that has been prepared separately and measure the intensity of the synthesized light, unlike the interferometer, but synthesizes the diffracted lights generated at fixed grating 38Y via moving grating 37Y and measures the intensity of the synthesized light. More specifically, the measurement light is not synthesized inside the housing of the encoder but is synthesized on the wafer stage WST side. Accordingly, even if the measurement light after the synthesis undergoes air fluctuations during a period when the measurement light returns from wafer stage WST to Y encoder 28Y, the phase difference between the two diffracted lights that is detected from the intensity variation of the synthesized light does not vary. Accordingly, it is difficult for Y encoder 28Y to be affected by air fluctuations even if wafer stage WST is away from Y encoder 28Y. Consequently, the high-precision position measurement of wafer stage WST becomes possible by using Y encoder 28Y.

In this case, the diffraction angle of the diffracted light generated at moving grating 37Y is determined according to a wavelength of measurement light BE and a pitch of moving grating 37Y. Similarly, the diffraction angle of the diffracted light generated at fixed grating 38Y is determined according to a wavelength of measurement light BE and a pitch of fixed grating 38Y. Accordingly, a positional relation in the Z-axis direction between moving grating 37Y and fixed grating 38Y needs to be set appropriately in accordance with the wavelength of measurement light BE, the pitch of moving grating 37Y and the pitch of fixed grating 38Y, so that the diffracted lights generated at fixed grating 38Y are converged on one optical axis via moving grating 37Y.

Incidentally, the case has been described above where the ±first-order diffracted lights are used of a plurality of diffracted lights generated at moving grating 37Y and fixed grating 38Y, but the present invention is not limited thereto, and arbitrary order (±second-order, ±third-order, . . . ) diffracted lights can also be used except for a zero order light. In this case as well, a positional relation in the Z-axis direction between moving grating 37Y and fixed grating 38Y needs to be set appropriately so that the diffracted lights generated at fixed grating 38Y are converged on one optical axis via moving grating 37Y.

Although the explanation is given out of sequence, as shown in FIGS. 2A and 2B, reflection surface 36Y to which measurement lights B1 and B2 from Y interferometer 26Y described earlier are perpendicularly irradiated is formed on a part of a surface of optical member 30Y on the −Y side, or to be more specific, on the −Y side end surface of holding member 34 that constitutes a lower half of the −Y side surface of optical member 30Y. In this case, the length of reflection surface 36Y in the X-axis direction is substantially equal to the length of prism 32 in the X-axis direction, and a width of reflection surface 36Y in the Z-axis direction is set so as to cover the movement stroke of wafer stage WST in the Z-axis direction.

In this embodiment, the optical path length between optical member 30Y and fixed grating 38Y is sufficiently short relative to the optical path length of measurement light BE between Y encoder 28Y and optical member 30Y fixed to wafer stage WST. And, as is described previously, the substantial measurement axis of Y interferometer 26Y in the Y-axis direction coincides with the measurement axis of Y encoder 28Y (the optical path of measurement light BE).

With the configuration described above, Y measuring system 20Y is substantially equipped with two measurement devices (Y interferometer 26Y and Y encoder 28Y) having a common measurement axis. Therefore, if each grating has no manufacturing error, attachment error, deformation due to time passage and the like, and there is no error due to air fluctuations, then peculiar measurement errors caused by the Abbe error due to rotation/inclination of wafer stage WST, and by errors accompanying local deformation of an irradiation surface of the measurement beam (the measurement light) and the like are solved. In other words, if measurement errors caused by the gratings, and measurement errors caused by air fluctuations do not occur, then equal measurement results can be obtained by Y interferometer 26Y and Y encoder 28Y.

Figure 3:
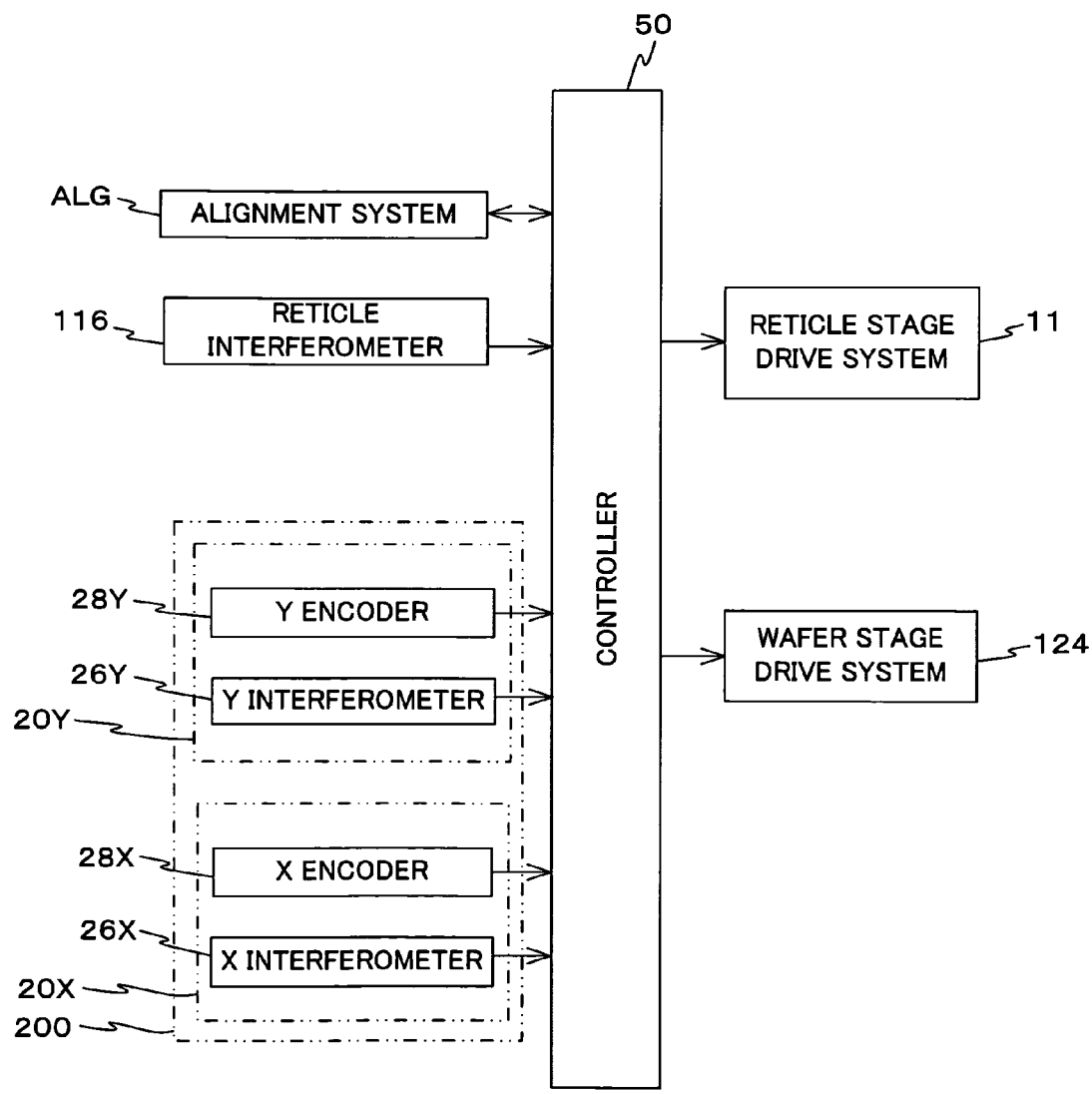
FIG. 3 is a block diagram showing a main configuration of a control system of the exposure apparatus related to the first embodiment.

X measuring system 20X is placed on the +X side or the −X side of wafer stage WST, and includes an X interferometer 26X and an X encoder 28X as shown in FIG. 3. X measuring system 20X is configured similar to Y measuring system 20Y described above. Accordingly, on a surface of wafer stage WST on the +X side or the −X side, an optical member (which is to be 30X for the sake of convenience) that is configured similar to optical member 30Y is fixed. More specifically, in this embodiment, wafer stage WST and optical members 30Y and 30X constitute a movable body. In this embodiment, this movable body is referred to as wafer stage WST as needed. The same can be said also in a second embodiment to be described later. Further, the substantial measurement axis of X measuring system 20X is an axis that is orthogonal to the optical axis of projection optical system PL and is parallel to the X-axis.

By introducing Y measuring system 20Y as the position measuring system to measure the Y-position of wafer stage WST, measurement of the Y-position of wafer stage WST using Y interferometer 26Y and Y encoder 28Y in a complementary manner can be performed. Further, by introducing X measuring system 20X as the position measuring system to measure the X-position of wafer stage WST, measurement of the X-position of wafer stage WST using X interferometer 26X and X encoder 28X in a complementary manner can be performed.

FIG. 3 shows a main configuration of a control system of exposure apparatus 100. This control system is mainly configured of controller 50 that is composed of a microcomputer (or a workstation) that performs overall control of the entire apparatus.

With exposure apparatus 100 in this embodiment having the configuration as is described above, calibration data used to calibrate measurement errors of Y encoder 28Y caused by moving grating 37Y and fixed grating 38Y is created in advance in the following manner, prior to start of exposure processing. More specifically, in response to instructions of an operator, controller 50 drives wafer stage WST in the Y-axis direction based on measurement values of Y interferometer 26Y at a speed (a low speed) of a level with which measurement lights B1 and B2 are not affected by air fluctuations, and also loads measurement values of Y encoder 28Y and Y interferometer 26Y simultaneously at predetermined sampling intervals. Then, by using the loaded sampling data, controller 50 computes calibration information used to calibrate (correct) measurement values of Y encoder 28Y and stores the calibration information in a memory. The calibration information can be in a function format or a map data format. Similarly, controller 50 computes calibration information used to calibrate (correct) measurement values of X encoder 28X and stores the calibration information in a memory.

In exposure apparatus 100 of this embodiment, under instructions of controller 50, reticle alignment and baseline measurement of wafer alignment system ALG, and wafer alignment such as EGA are performed in the procedure similar to the one for a conventional scanner. Then, based on the wafer alignment results, an exposure processing operation by a step-and-scan method is performed and a pattern of reticle R is transferred to each of a plurality of shot areas on wafer W. This exposure processing operation is performed by alternately repeating an inter-shot stepping operation to move wafer stage WST that holds wafer W to an acceleration starting position for exposure of the next shot area on wafer W and the scanning exposure operation described previously.

When performing the exposure processing operation described above, controller 50 measures the Y-position of wafer stage WST using Y encoder 28Y, and calibrates (corrects) the measurement results using the calibration information created beforehand, and also measures the X-position of wafer stage WST using X encoder 28X, and calibrates (corrects) the measurement results using the calibration information created beforehand. Then, based on the measurement values of encoders 28Y and 28X after the calibration, controller 50 drives and controls wafer stage WST. With this operation, stable and high-precision drive control of wafer stage WST can be performed.

Incidentally, for example, abnormality could occur in which a foreign material adheres on moving grating 37Y and measurement light BE (diffracted lights $BE_1$ and $BE_2$) is cut off and measurement of the position of wafer stage WST with Y encoder 28Y becomes impossible. When such abnormality occurs, in this embodiment, it is also possible that controller 50 switches the control method so as to immediately drive and control wafer stage WST based on the measurement values of Y interferometer 26Y. More specifically, position measurement by a hybrid method is performed in which Y encoder 28Y that is excellent in measurement accuracy is used at normal times, and Y interferometer 26Y that is excellent in stability is used at abnormal times of Y encoder 28Y. With this position measurement, stable and high-precision drive control of wafer stage WST can be performed.

As is described above, according to exposure apparatus 100 of this embodiment, the measurement axes in the Y-axis direction of Y interferometer 26Y and Y encoder 28Y, which constitute Y measuring system 20Y, substantially coincide with each other. Therefore, positional information of wafer stage WST in the Y-axis direction that is measured respectively by Y interferometer 26Y and Y encoder 28Y hardly includes measurement errors between them caused by θz rotation or local deformation of wafer stage WST, or the like. Accordingly, as is described earlier, when wafer stage WST is driven at a low speed and positional information of wafer stage WST is measured using Y interferometer 26Y and Y encoder 28Y during the driving, measurement beams B1 and B2 of Y interferometer 26Y are hardly affected by air fluctuations, and therefore reliability of the measurement values of Y interferometer 26Y is improved. And, by creating calibration information of the measurement values of Y encoder 28Y using the measurement values of Y interferometer 26Y, high-precision calibration information can be created.

Further, according to exposure apparatus 100 of this embodiment, for the reasons similar to the above, positional information of wafer stage WST in the X-axis direction that is measured respectively by X interferometer 26X and X encoder 28X hardly includes measurement errors between them caused by θz rotation or local deformation of wafer stage WST, or the like. Further, similarly to the case described previously, by creating calibration information of the measurement values of X encoder 28X using the measurement values of X interferometer 26X, high-precision calibration information can be created.

And, when performing the exposure processing operation, wafer stage WST is driven and controlled in the XY two-dimensional directions based on the measurement values of Y encoder 28Y and the calibration information created beforehand, and the measurement values of X encoder 28X and the calibration information created beforehand. With this operation, high-precision drive control of wafer stage WST can be performed without being affected by air fluctuations and without being affected by measurement errors caused by moving grating 37Y and fixed grating 38Y. Further, in this embodiment, since all the measurement axes of Y encoder 28Y and X encoder 28X pass through the optical axis of projection optical system PL, high-precision position measurement of, and hence, high-precision position control of wafer stage WST in the XY two-dimensional directions without the Abbe error can be performed.

Consequently, according to exposure apparatus 100 of this embodiment, a pattern of reticle R can be transferred to a plurality of shot areas on wafer W with high precision.

Figure 4A:
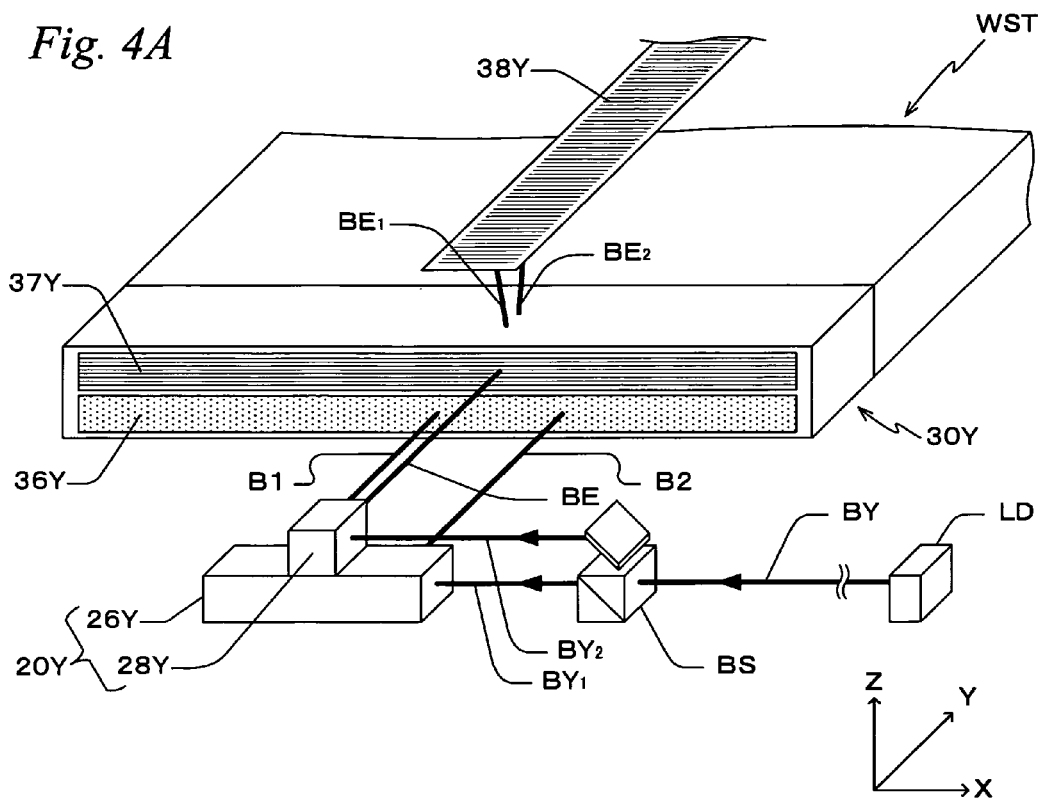
FIGS. 4A and 4B are views used to explain a modified example of the first embodiment.
Figure 4B:
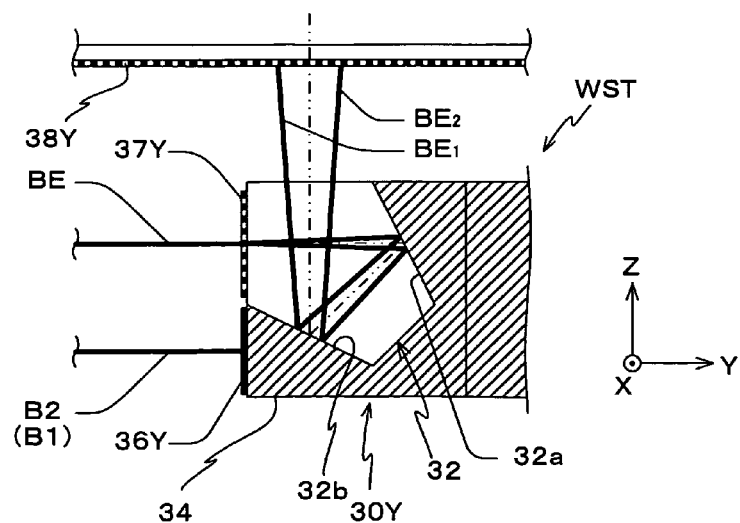

Incidentally, in the embodiment above, the case has been described where moving grating 37Y is placed on the upper surface (the surface on the +Z side) of prism 32, but the present invention is not limited thereto, and as shown in FIGS. 4A and 4B for example, moving grating 37Y can be placed on the surface of prism 32 on the −Y side. However, moving grating 37Y of this case has its periodic direction in the Z-axis direction that corresponds to the periodic direction of fixed grating 38Y. In this case, the optical paths of +first-order diffracted lights $BE_1$ and $BE_2$, which are generated at moving grating 37Y by measurement light BE being irradiated, are deflected to the +Z direction sequentially via reflection surfaces 32a and 32b of prism 32, and ±first-order diffracted lights $BE_1$ and $BE_2$ are irradiated to fixed grating 38Y. Accordingly, a plurality of diffracted lights are generated at fixed grating 38Y, and of these diffracted lights, a −first-order diffracted light of +first-order diffracted light $BE_1$ generated at moving grating 37Y and a +first-order diffracted light of −first-order diffracted light $BE_2$ generated at moving grating 37Y trace the optical paths of original diffracted lights, respectively, and their optical paths are deflected to the −Y direction sequentially via reflection surfaces 32b and 32a, and the ±first-order diffracted lights are coaxially synthesized via moving grating 37Y, and enter a detector (not shown).

The placement location of moving grating 37Y is not limited to the surface on the +Z side and the surface on the −Y side of optical member 30Y described above, but can be arbitrarily set as far as the placement location is in the optical path of measurement light BE and moving grating 37Y is placed on a member fixed to wafer stage WST (or a part of wafer stage WST). For example, one of reflection surfaces 32a and 32b of prism 32 can be a reflective type diffraction grating and that diffraction grating can be used as moving grating 37Y. However, the periodic direction of the diffraction grating is to be a direction corresponding to the periodic direction of fixed grating 38Y. With either of the configurations, the effects equivalent to those with the configuration of the embodiment described earlier can be obtained.

Incidentally, in the embodiment above and the modified examples, the case has been exemplified where a single light source LD is used for both Y interferometer 26Y and Y encoder 28Y, but two light sources are arranged and a light can be supplied to Y interferometer 26Y and Y encoder 28Y using each of the light sources. Further, each of the two light sources can be housed inside the housing of each of Y interferometer 26Y and Y encoder 28Y.

Second Embodiment

A second embodiment of the present invention is explained next, based on FIGS. 5A and 5B. Here, for the constituents that are the same as or similar to those in the first embodiment described previously, the same reference signs are used, and the explanation thereof are simplified or omitted. An exposure apparatus of the second embodiment is different from the exposure apparatus of the first embodiment, only in a configuration of a position measuring system that measures the position of wafer stage WST. Therefore, the different points are mainly described below in order to avoid redundant description.

Figure 5A:
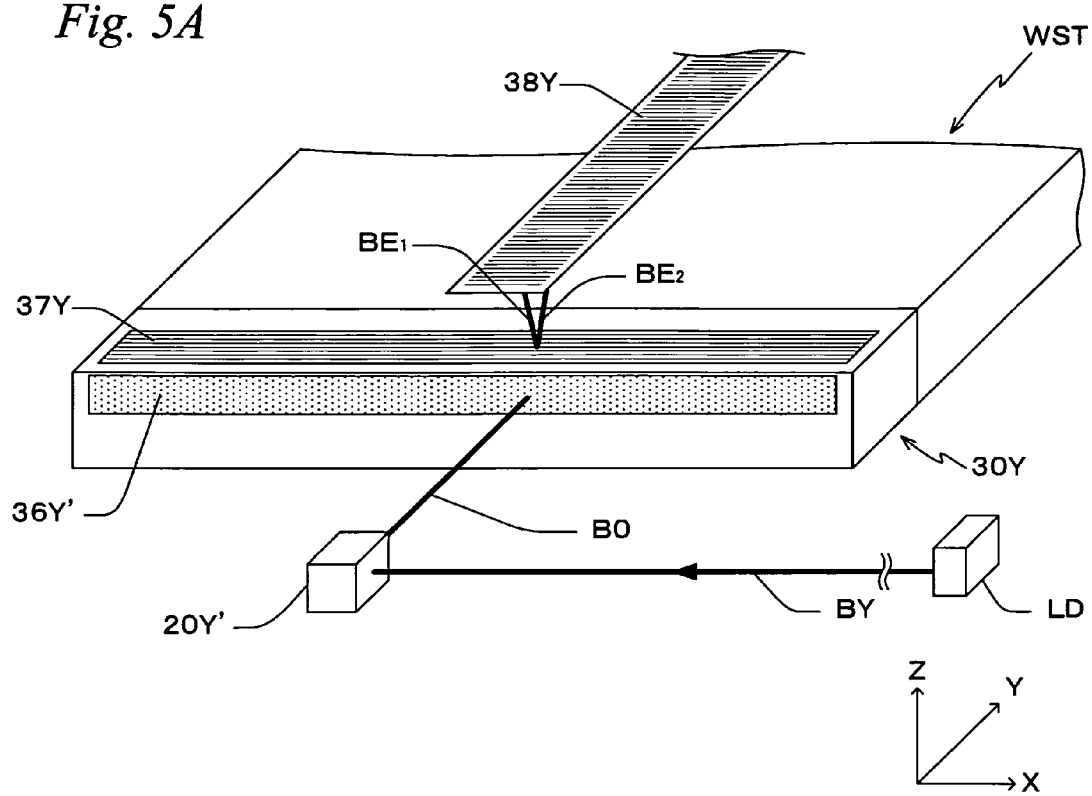

In the second embodiment, as shown in FIG. 5A, instead of Y measuring system 20Y in the first embodiment described earlier, a Y measuring unit (hereinafter, shortly referred to as a unit, as needed) 20Y' is arranged as a Y measuring system. Laser light BY from light source LD enters Y measuring unit 20Y' along an optical path parallel to the X-axis. However, in the second embodiment, as light source LD, a two-frequency laser (He—Ne gas laser) utilizing the Zeeman effect is used. This light source is frequency-stabilized and emits a laser beam made up of a circular beam having the Gaussian distribution that includes two polarization components whose frequencies are different by 2 to 3 MHz by using the Zeeman effect (accordingly, the wavelengths are different) and whose deflection directions are orthogonal to each other.

An optical path of light BY that has entered Y measuring unit 20Y' is deflected to the +Y direction inside unit 20Y', and light BY is irradiated perpendicularly to a reflection surface 36Y' of optical member 30Y fixed to wafer stage WST, as a measurement light B0. Incidentally, an optical path (an optical axis) of measurement light B0 is set so as to be orthogonal to optical axis AX of projection optical system PL.

Figure 5B:
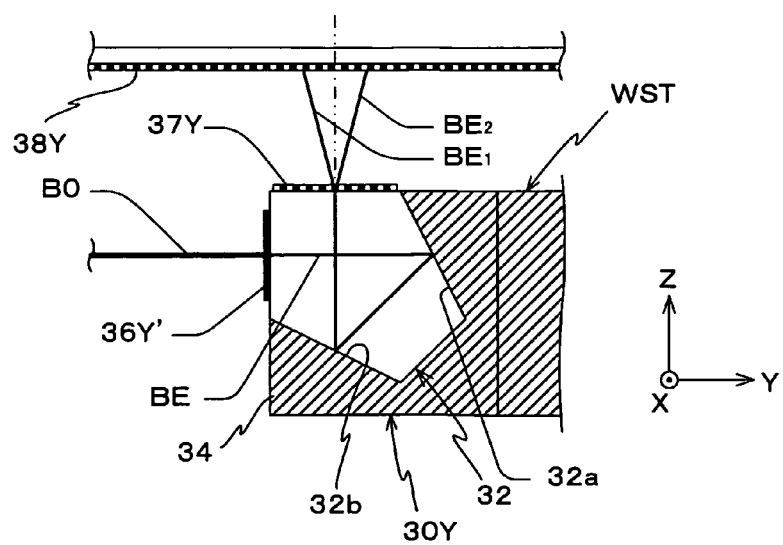

As shown in FIGS. 5A and 5B, optical member 30Y is configured similar to the one in the first embodiment. However, in the second embodiment, reflection surface 36Y' is formed on the −Y end surface of prism 32. Further, reflection surface 36Y' is composed of a polarization separation film (or a semi-transmissive film), and performs polarization-separation of an incident light (or splits an incident light into two). The length of reflection surface 36Y' in the X-axis direction is substantially equal to the length of optical member 30Y in the X-axis direction.

When measurement light B0 emitted from Y measuring unit 20Y' is irradiated perpendicularly to reflection surface 36Y' arranged on optical member 30Y, measurement light B0 is polarized/separated by reflection surface 36'. Light BE that has been transmitted through reflection surface 36Y' operates similarly to measurement light BE of Y encoder 28Y in the first embodiment. More specifically, light BE is sequentially reflected off two reflection surfaces 32a and 32b of prism 32, the optical path of light BE is deflected to the +Z direction, and light BE is irradiated to moving grating 37Y. Accordingly, a plurality of diffracted lights whose diffraction angles are different within the YZ plane are generated. In FIGS. 5A and 5B, +first-order diffracted light $BE_1$ and −first-order diffracted light $BE_2$ of the plurality of diffracted lights are shown.

Diffracted lights $BE_1$ and $BE_2$ generated at moving grating 37Y are irradiated to fixed grating 38Y. Accordingly, a plurality of diffracted lights whose diffraction angles are different within the YZ plane are generated again at fixed grating 38Y. In this case, a −first-order diffracted light of +first-order diffracted light $BE_1$ generated at moving grating 37Y and a +first-order diffracted light of −first-order diffracted light $BE_2$ generated at moving grating 37Y are irradiated to moving grating 37Y along the optical path of the original diffracted lights, respectively.

The ±first-order diffracted lights described above from fixed grating 38Y are converged (synthesized) on the same axis via moving grating 37Y. The optical path of the synthesized light is deflected to the −Y direction via prism 32 and the synthesized light is irradiated to reflection surface 36Y'. Then, the synthesized light is further synthesized with measurement light B0 reflected off reflection surface 36Y', by being transmitted through reflection surface 36Y', and received by a detector inside a housing of Y measuring unit 20Y'. The intensity and the phase of the synthesized light (hereinafter, referred to as a first synthesized light, for identification) that has been received by the detector are measured by a measurement unit (not shown). In this case, the measurement unit compares the phase of the first synthesized light and a phase of a reference light generated within unit 20Y', and from the difference between the phase of the first synthesized light and the phase of the reference light, detects a first relative displacement between unit 20Y' and reflection surface 36Y'. Incidentally, by employing the heterodyne detection method, the phase difference between the reflected light from reflection surface 36Y' and the reference light can be detected, separately from the phase difference between a synthesized light (hereinafter, referred to as a second synthesized light, for identification) of the ±first-order diffracted lights from fixed grating 38Y and the reference light.

Meanwhile, the intensity of the first synthesized light varies sinusoidally with a relative displacement in the Y-axis direction between moving grating 37Y and fixed grating 38Y, because the ±first-order diffracted lights generated at fixed grating 38Y interfere with each other. Therefore, the measurement unit detects a phase difference between the ±first-order diffracted lights from the intensity variation of the first synthesized light, and from the phase difference, obtains a second relative displacement between moving grating 37Y and fixed grating 38Y.

The measurement results of the first and second relative displacements are sent to controller 50. From each of the measurement results of the first and second relative displacements, controller 50 computes a displacement of wafer stage WST in the Y-axis direction from a reference position, i.e. the position in the Y-axis direction (Y-position).

Incidentally, as is obvious from the measurement principle of Y measuring unit 20Y', Y measuring unit 20Y' is a measurement device that is equipped with an interferometer section and an encoder section as a unit. In this case, the measurement results of the first and second relative displacements correspond to the measurement results of the interferometer section and the encoder section, respectively.

The encoder section of Y measuring unit 20Y' synthesizes the diffracted lights generated at fixed grating 38Y on the wafer stage WST side and the receives the synthesized light with the detector, and therefore even if the synthesized light is affected by air fluctuations during the period when the synthesized light returns from wafer stage WST to the detector, measurement errors do not occur. Accordingly, it is hard for the encoder section of Y measuring unit 20Y' to be affected by air fluctuations even if wafer stage WST is away from Y measuring unit 20Y'. Consequently, by using the encoder section of Y measuring unit 20Y', measurement of the Y-position of wafer stage WST with high precision can be performed.

Incidentally, in the above description, the first-order diffracted lights of a plurality of diffracted lights generated at moving grating 37Y and fixed grating 38Y are to be used, but arbitrary order (±second-order, ±third-order, ... ) diffracted lights except for a zero-order light can also be used. Also in this case, the positional relation in the Z-axis direction between moving grating 37Y and fixed grating 38Y needs to be appropriately set so that the diffracted lights generated at fixed grating 38Y are converged on one optical axis via moving grating 37Y.

In the second embodiment, the optical path length between optical member 30Y and fixed grating 38Y is sufficiently short with respect to the optical path length of measurement light B0 between Y measuring unit 20Y' and optical member 30Y fixed to wafer stage WST. And, the interferometer section and the encoder section of Y measuring unit 20Y' shares the measurement axis.

With the above-described configuration, Y measuring unit 20Y' is equipped with two measurement sections (the interferometer section and the encoder section) having a common measurement axis. Therefore, if each grating has no manufacturing error, attachment error, deformation due to time passage and the like, and there is no error due to air fluctuations, then peculiar measurement errors of the interferometer section and the encoder section, which are caused by the Abbe error due to rotation/inclination of wafer stage WST, errors accompanying local deformation of the irradiation surfaces of measurement beams (measurement lights), and the like, are solved. In other words, if measurement errors of the encoder section caused by the gratings, and measurement errors caused by air fluctuations do not occur, then the interferometer section and the encoder section can obtain the equal measurement results.

Further, in the second embodiment, in order to measure the X-position of wafer stage WST, an X measuring unit (not shown) having a configuration similar to the configuration of Y measuring unit 20Y' is placed on the +X side or the −X side of wafer stage WST. The X measuring unit has a measurement axis that is orthogonal to the optical axis of projection optical system PL and is parallel to the X-axis.

By introducing Y measuring unit 20Y' as the position measuring system to measure the Y-position of wafer stage WST, it becomes possible to perform measurement of the Y-position of wafer stage WST using the interferometer section and the encoder section of Y measuring unit 20Y' in a complementary manner. Further, by introducing the X measuring unit as the position measuring system to measure the X-position of wafer stage WST, it becomes possible to perform X-position measurement of wafer stage WST using the interferometer section and the encoder section of the X measuring unit in a complementary manner.

The configuration and the like of other sections of the exposure apparatus of the second embodiment are similar to those in the first embodiment.

In the exposure apparatus of the second embodiment having the configuration as is described above, the encoder section and the interferometer section of Y measuring unit 20Y' respectively include optical member 30Y fixed to wafer stage WST (from another point of view, optical member 30Y is a part of a movable body that includes wafer stage WST and optical member 30Y), and therefore, the optical path of the measurement light of the encoder section and the optical path of the measurement light of the interferometer section can be made coincident. More specifically, the measurement axes of the encoder section and the interferometer section can be made coincident. Further, the measurement axes of the encoder section and the interferometer section, which constitute the X measuring unit, can be made coincident.

Consequently, according to the exposure apparatus of the second embodiment, the effects equivalent to those in the first embodiment described earlier can be obtained. In addition, since the encoder section and the interferometer section of Y measuring unit 20Y' include the common optical member 30Y in their parts, respectively, the number of components can be reduced, compared to the case when the encoder section and the interferometer section are completely separated.

Figure 6A:
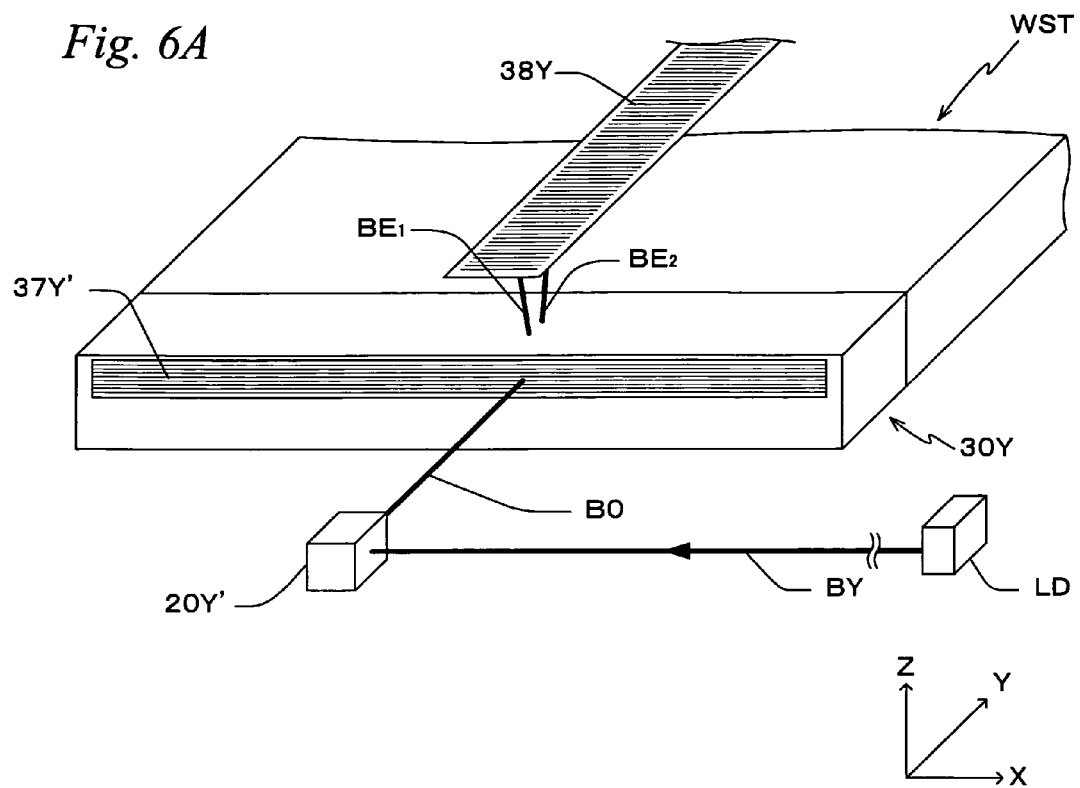
FIGS. 6A and 6B are views used to explain a modified example of the second embodiment.
Figure 6B:
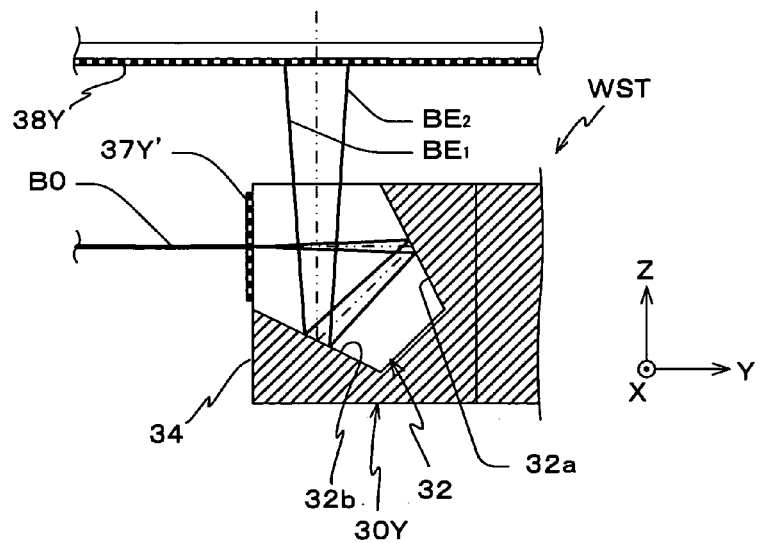

Incidentally, in the second embodiment above, the case has been described where moving grating 37Y is placed on the upper surface (the surface on the +Z side) of prism 32, but this placement is not intended to be limiting, and for example, as shown in FIGS. 6A and 6B, a moving grating 37Y' which also serves as a reflection surface can be placed on the surface on the −Y side of prism 32. However, moving grating 37Y' in this case has its periodic direction in the Z-axis direction that corresponds to the periodic direction of fixed grating 38Y. In this case, diffracted lights $BE_1$ and $BE_2$, which are generated at moving grating 37Y' as a result of measurement light B0 being irradiated, are sequentially reflected off reflection surfaces 32a and 32b of prism 32, and then the optical paths are deflected to the +Z direction, and diffracted lights $BE_1$ and $BE_2$ are irradiated to fixed grating 38Y. Then, diffracted lights generated at fixed grating 38Y trace the optical paths of the original diffracted lights and their optical paths are deflected to the −Y direction after sequentially being reflected off reflection surfaces 32b and 32a, and the diffracted lights are coaxially synthesized via moving grating 37Y'.

Then, this synthesized light is further synthesized with a reflected light of measurement light B0 reflected off moving grating 37Y', and propagates to the −Y direction, and then is received by a detector inside Y measuring unit 20Y'. Also with this configuration, the effects similar to those in the configuration described above can be obtained.

In each of the embodiments and the modified examples described above, the case has been exemplified where the optical member is fixed to an end portion of wafer stage WST, but a cutout, into which prism 32 is fitted, is formed at a part of wafer stage WST and prism 32 can be fitted into the cutout. Further, in each of the embodiments and the modified examples described above, pentaprism 32 is to be used, but this is not intended to be limiting, and any optical element can be used as far as the optical element can convert the optical path of an incident light into the optical path of an outgoing light with a 90-degree angle difference. For example, a pentamirror can also be used, instead of the pentaprism.

Further, in each of the embodiments and the modified examples described above, two Y measuring systems (20Y or 20Y') used to measure the Y-position of wafer stage WST can be arranged a predetermined distance apart in the X-axis direction. In such a case, together with the Y-position of wafer stage WST, the yawing θz (rotation about the Z-axis) can be measured. In this case, the two Y measuring systems (20Y or 20Y') can be placed so that measurement axes of the two Y measuring systems are located at an equal distance from an axis parallel to the Y-axis that is orthogonal to the optical axis of projection optical system PL. In such a case, the Y-position of wafer stage WST can be measured without the Abbe error based on the average value of the measurement values of the two Y measuring systems. Two X measuring systems each having the configuration similar to the Y measuring system (20Y or 20Y') can also be arranged a predetermined distance apart in the Y-axis direction.

Alternatively, one each of the Y measuring system (20Y or 20Y') can be placed on both sides of wafer stage WST in the Y-axis direction. In this case, on both end portions of wafer stage WST in the Y-axis direction, optical member 30Y and moving grating 37Y are arranged. Also with this configuration, the effects equivalent to those with the placement described above can be obtained. An X measuring system having a configuration similar to that of the Y measuring system (20Y or 20Y') can also be arranged on the +X side and the −X side of wafer stage WST.

Incidentally, in the case where two or more in total of the X measuring system(s) and the Y measuring system(s) are placed on arbitrary sides out of the +X, −X, +Y and −Y sides of wafer stage WST, all of such measuring systems, or two or more of such measuring systems can share the same light source. In this case, only either of encoders (first measurement devices) or interferometers (second measurement devices), which constitute the respective measuring systems, can share the same light source, or, both of the encoders (first measurement devices) and the interferometers (second measurement devices), which constitute the respective measuring systems, can share the same light source.

Further, in each of the embodiments and the modified examples described above and the like, the case has been described where the Y measuring system and the X measuring system both have the encoder and the interferometer, but the present invention is not limited thereto. More specifically, the exposure apparatus in each of the embodiments is a scanner, and therefore, only for the measurement in the Y-axis direction serving as a scanning direction, the Y measuring system that can perform high-precision position measurement and position control of wafer stage WT is used, and the X measuring system that measures the position of wafer stage WST in the X-axis direction that is a non-scanning direction can be configured using only either of the interferometer or the encoder.

Incidentally, the configuration of the encoder is not limited to the configuration described in each of the embodiments and the modified examples described above. For example, in each of the embodiments and the modified examples described above, the case has been exemplified where the encoder is equipped with a moving grating placed on a part of wafer stage WST and a fixed grating placed outside (above) wafer stage WST, but this is not intended to be limiting, and the encoder is equipped with only either one of the gratings. For example, in the case where a grating is placed outside (above) wafer stage WST, a configuration can be employed in which a measurement light is irradiated to the grating via a reflection surface arranged on wafer stage WST and diffracted lights from the grating return to a photodetection system via the reflection surface. In this case, an optical member such as a grating that makes the return lights (the diffracted lights) interfere is arranged within the photodetection system. Further, in the case where a grating is placed only on a part of wafer stage WST, similarly, an optical member such as a grating that makes the diffracted lights from the grating interfere can be arranged within the photodetection system. The point is that a measurement light irradiated to a reflection surface and a measurement light irradiated to a grating should be irradiated to the reflection surface and the grating, respectively, along the optical paths parallel to the Y-axis direction (or the X-axis direction) via at least a part of the same optical system. This allows the optical paths of both the measurement lights to be close to each other.

Further, in the description above, the member, on which the reflection surface to which the measurement light of the interferometer is irradiated and the reflection surface (or the grating) to which the measurement light of the encoder is irradiated are arranged, is to be a separate member from wafer stage WST, but this is not intended to be limiting, and these reflection surfaces (or the grating) can also be formed integrally with wafer stage WST.

Further, as the interferometer, instead of, or in addition to the interferometer(s) for X-axis direction position measurement and/or Y-axis direction position measurement, an interferometer for Z-axis direction position measurement can be arranged.

Further, in each of the embodiments, the position of the wafer stage is to be adjusted using the calibration data described previously, but the position of the wafer stage can be controlled based on the measurement values of the encoder and the position of the reticle stage can be adjusted using the calibration data described above.

Further, in each of the embodiments, the interferometer is to be used for calibration of the encoder and/or for backup, but the use of the interferometer is not limited thereto, and for example, the interferometer can be used in combination with the encoder to control the position of wafer stage WST.

Incidentally, in each of the embodiments, the case has been described where the measuring system equipped with the encoder and the interferometer is used for position measurement of wafer stage WST, but the this is not intended to be limiting, and a measuring system equipped with an encoder and an interferometer can also be used for position measurement of reticle stage RST.

Further, in each of the embodiments described above, the case has been described where the present invention is applied to a dry-type exposure apparatus that performs exposure of wafer W without liquid (water), but this is not intended to be limiting, and the present invention can also be applied to an exposure apparatus in which a liquid immersion space including an optical path of an illumination light is formed between a projection optical system and a plate and the plate is exposed with the illumination light via the projection optical system and liquid in the liquid immersion space, as is disclosed in, for example, the pamphlet of International Publication No. 99/49504, European Patent Application publication No. 1 420 298, the pamphlet of International Publication No. 2004/055803, Kokai (Japanese Unexamined Patent Application Publication) No. 2004-289126 (the corresponding U.S. Pat. No. 6,952,253) and the like.

Further, in each of the embodiments described above, the case has been described where the present invention is applied to a scanning exposure apparatus by a step-and-scan method or the like, but this is not intended to be limiting, and the present invention can also be applied to a static exposure apparatus such as a stepper. Even with the stepper or the like, the similar effects can be obtained because the position of a stage on which an object that is subject to exposure is mounted can be measured using an encoder in a similar manner to the manner in the embodiments described above. Further, the present invention can also be applied to a reduced projection exposure apparatus by a step-and-stitch method that synthesizes a shot area and a shot area, an exposure apparatus by a proximity method, a mirror projection aligner, or the like. Moreover, the present invention can also be applied to a multi-stage type exposure apparatus equipped with a plurality of wafer stages, as is disclosed in, for example, U.S. Pat. Nos. 6,590,634, 5,969,441, 6,208,407, and the like. Furthermore, the present invention can also be applied to an exposure apparatus that is equipped with a measurement stage including measurement members (e.g. a fiducial mark, and/or a sensor), which is separate from the wafer stage, as is disclosed in, for example, the pamphlet of International Publication No. 2005/074014 and the like.

Further, the magnification of the projection optical system in the exposure apparatus in each of the embodiments described above is not only a reduction system, but also can be either an equal magnifying system or a magnifying system, and projection optical system PL is not only a dioptric system, but also can be either a catoptric system or a catadioptric system, and in addition, the projected image can be either an inverted image or an upright image. Moreover, the illumination area and the exposure area described earlier are to have a rectangular shape, but the shape is not limited thereto, and can also be circular arc, trapezoidal, parallelogram or the like.

Incidentally, the light source of the exposure apparatus in each of the embodiments described above is not limited to the ArF excimer laser, but a pulsed laser light source such as a KrF excimer laser (output wavelength: 248 nm), an $F_2$ laser (output wavelength: 157 nm), an $Ar_2$ laser (output wavelength: 126 nm) or a $Kr_2$ laser (output wavelength: 146 nm), or an extra-high pressure mercury lamp that generates an emission line such as a g-line (wavelength: 436 nm) or an i-line (wavelength: 365 nm) can also be used. Further, a harmonic wave generating device of a YAG laser or the like can also be used. Besides the forgoing light sources, as is disclosed in, for example, U.S. Pat. No. 7,023,610, a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

Further, in each of the embodiments described above, illumination light IL of the exposure apparatus is not limited to the light having a wavelength more than or equal to 100 nm, and it is needless to say that the light having a wavelength less than 100 nm can be used. For example, in recent years, in order to expose a pattern less than or equal to 70 nm, an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective mask has been developed. In the EUV exposure apparatus, the arrangement in which scanning exposure is performed by synchronously scanning a mask and a wafer using a circular arc illumination can be considered, and therefore, the present invention can also be suitably applied to such an exposure apparatus. In addition, the present invention can also be applied to an exposure apparatus that uses charged particle beams such as an electron beam or an ion beam.

Further, in each of the embodiments described above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (a spatial light modulator) or the like) on which a light-transmitting pattern, a reflection pattern, or an emission pattern is formed according to electronic data of the pattern that is to be exposed can also be used. Further, as is disclosed in, for example, the pamphlet of International Publication No. 2001/035168, the present invention can also be applied to an exposure apparatus (a lithography system) that forms device patterns on wafer W by forming interference fringes on wafer W.

Moreover, the present invention can also be applied to an exposure apparatus that synthesizes two reticle patterns on a wafer via a projection optical system and almost simultaneously performs double exposure of one shot area on the wafer by one scanning exposure, as is disclosed in, for example, U.S. Pat. No. 6,611,316.

Further, an apparatus that forms a pattern on an object is not limited to the exposure apparatus (the lithography system) described earlier, and for example, the present invention can also be applied to an apparatus that forms a pattern on an object by an ink-jet method.

Incidentally, an object on which a pattern should be formed (an object subject to exposure to which an energy beam is irradiated) in each of the embodiments described above is not limited to a wafer, but can be other objects such as a glass plate, a ceramic substrate, a film member, or a mask blank.

The use of the exposure apparatus is not limited to the exposure apparatus used for manufacturing semiconductor devices, but the present invention can be widely applied also to, for example, an exposure apparatus for manufacturing liquid crystal display devices which transfers a liquid crystal display device pattern onto a square-shaped glass plate, and to an exposure apparatus for manufacturing organic ELs, thin-film magnetic heads, imaging devices (such as CCDs), micromachines, DNA chips or the like. Further, the present invention can also be applied to an exposure apparatus that transfers a circuit pattern onto a glass substrate or a silicon wafer not only when producing microdevices such as semiconductor devices, but also when producing a reticle or a mask used in an exposure apparatus such as an optical exposure apparatus, an EUV exposure apparatus, an X-ray exposure apparatus, and an electron beam exposure apparatus.

Incidentally, in each of the embodiments described above, the case has been described where the movable body apparatus of the present invention equipped with the encoder (the first measurement device) and the interferometer (the second measurement device) is applied to the exposure apparatus, but this is not intended to be limiting, and the movable body apparatus can also be applied to other apparatus. For example, the movable body apparatus of the present invention can suitably be applied to apparatuses such as an inspecting apparatus that measures the position, the linewidth and the like of a reticle pattern.

Incidentally, the above disclosures of the various publications, the pamphlets of the International Publications, and the U.S. patent application Publications descriptions, and the U.S. patents descriptions that are cited in the description above and related to exposure apparatuses and the like are each incorporated herein by reference.

Electron devices such as semiconductor devices are manufactured through the following steps: a step where the function/performance design of a device is performed; a step where a reticle based on the design step is manufactured; a step where a wafer is manufactured using materials such as silicon; a lithography step where a pattern of the reticle is transferred onto the wafer with the exposure apparatus (the pattern formation apparatus) of the embodiments described earlier; a development step where the exposed wafer is developed; an etching step where an exposed member of an area other than the area where resist remains is removed by etching; a resist removing step where the resist that is no longer necessary when the etching is completed is removed; a device assembly step (including a dicing process, a bonding process, and a packaging process); an inspection step; and the like. In this case, in the lithography step, the exposure method described earlier is executed using the exposure apparatus of the embodiments described above and device patterns are formed on the wafer, and therefore, highly-integrated devices can be manufactured with high productivity.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A movable body apparatus, comprising:
a movable body that moves in at least one axial direction along a predetermined plane;
a first measurement device that includes a moving grating which is arranged on the movable body and to which a first measurement light is irradiated along an optical path that includes a first optical path that extends parallel to the one axial direction, a fixed grating which is arranged outside the movable body and has a periodic direction in the one axial direction and to which a diffracted light generated at the moving grating is irradiated, and a photodetection system which receives a diffracted light from the fixed grating via the moving grating, and that measures positional information of the movable body in the one axial direction; and
a second measurement device that measures positional information of the movable body in the one axial direction, by irradiating a reflection surface arranged on the movable body with a second measurement light along a second optical path in the one axial direction, which is close to or overlaps with the first optical path, and receiving a reflected light from the reflection surface.

2. The movable body apparatus according to claim 1, wherein
a spacing distance between the moving grating and the fixed grating is shorter than a distance of the first optical path.

3. The movable body apparatus according to claim 1, wherein
the moving grating has a periodic direction in a direction corresponding to the periodic direction of the fixed grating.

4. The movable body apparatus according to claim 1, wherein
the first measurement device further includes an optical member that is fixed to the movable body and deflects an optical path of the first measurement light toward the fixed grating.

5. The movable body apparatus according to claim 4, wherein
at least one of the moving grating and the reflection surface is arranged on a surface of the optical member.

6. The movable body apparatus according to claim 1, wherein
the moving grating is arranged on a surface parallel to the predetermined plane.

7. The movable body apparatus according to claim 1, Wherein
the moving grating is arranged on a surface orthogonal to the first optical path.

8. The movable body apparatus according to claim 7, wherein
a surface of the moving grating also serves as the reflection surface.

9. The movable body apparatus according to claim 1, wherein
the first and second measurement lights are supplied from a same light source.

10. The movable body apparatus according to claim 9, wherein
the reflection surface is a semi-transmissive reflection surface, and
a light emitted from the same light source is irradiated to the reflection surface, and a transmitted light and a reflected light that are generated at the reflection surface are used as the first measurement light and the second measurement light, respectively.

11. The movable body apparatus according to claim 1, wherein
the photodetection system includes first and second photodetection elements that receive the diffracted light and the reflected light, respectively, and output signals corresponding to measurement results of the first and second measurement devices.

12. The movable body apparatus according to claim 1, wherein
the photodetection system receives a synthesized light of the diffracted light and the reflected light, and outputs signals corresponding to measurement results of the first and second measurement devices, based on each of an intensity and a phase of the synthesized light.

13. The movable body apparatus according to claim 1, further comprising:
a drive device that drives the movable body; and
a controller that controls the drive device based on a measurement result of a position measuring system that includes the first and second measurement devices.

14. The movable body apparatus according to claim 13, wherein
the movable body also moves in an orthogonal direction to the one axial direction within the predetermined plane, and
the movable body apparatus further comprises:
a third measurement device that has a configuration similar to the first measurement device, and uses a third measurement light irradiated to the movable body along a third optical path in the orthogonal direction; and a fourth measurement device that has a configuration similar to the second measurement device, and uses a fourth measurement light irradiated to the movable body along a fourth optical path in the orthogonal direction that is close to or overlaps with the third optical path, the third and fourth measurement devices being included in the position measuring system.

15. An exposure apparatus that forms a pattern on an object by irradiating the object with an energy beam, the apparatus comprising:
the movable body apparatus according to claim 1, which drives a movable body that holds the object along a predetermined plane, in order to form the pattern.

16. A device manufacturing method, comprising:
forming a pattern on an object by irradiating the object with an energy beam while the object is held on the movable body of the exposure apparatus according to claim 15; and
developing the object on which the pattern has been formed.

17. A pattern formation apparatus that forms a pattern on an object, the apparatus comprising:
a movable body that is movable and that holds the object;
a pattern generating device that forms a pattern on the object; and
the movable body apparatus according to claim 1, which drives the movable body within a predetermined plane.

18. The pattern formation apparatus according to claim 17, wherein
  the object has a sensitive layer, and
  the pattern generating device forms the pattern by irradiating the sensitive layer with an energy beam.

19. A device manufacturing method, comprising:
  forming a pattern on an object by irradiating the object with an energy beam while the object is held on the movable body of the pattern formation apparatus according to claim 17; and
  developing the object on which the pattern has been formed.

20. A movable body apparatus, comprising:
  a movable body that moves in at least one axial direction along a predetermined plane that includes the one axial direction and a second axial direction orthogonal to the one axial direction, the movable body holding an object that extends in a plane parallel to the predetermined plane;
  a first measurement device that measures positional information of the movable body in the one axial direction, by irradiating a fixed grating, which is arranged outside the movable body and has a periodic direction in the one axial direction, with a first measurement light along an optical path at least partially including a first optical path in the one axial direction, via a part of the movable body, and receiving a diffracted light from the fixed grating via the part of the movable body; and
  a second measurement device that measures positional information of the movable body in the one axial direction, by irradiating the part of the movable body with a second measurement light along a second optical path in the one axial direction and receiving a return light of the second measurement light from the movable body, wherein
  the first and second measurement devices each include a common optical member that constitutes the part of the movable body.

21. The movable body apparatus according to claim 20, wherein
  the optical member has a moving grating to which the first measurement light is irradiated and which has a periodic direction in a direction corresponding to the periodic direction of the fixed grating, and a reflection surface that reflects the second measurement light.

22. The movable body apparatus according to claim 21, wherein
  the moving grating is arranged on a surface parallel to the predetermined plane.

23. The movable body apparatus according to claim 21, wherein
  the moving grating is arranged on a surface orthogonal to the first optical path.

24. The movable body apparatus according to claim 23, wherein
  a surface of the moving grating also serves as the reflection surface.

25. The movable body apparatus according to claim 20, wherein
  the optical member further has a member that deflects an optical path of the first measurement light toward the fixed grating.

26. The movable body apparatus according to claim 20, wherein
  the first and second measurement lights are supplied from a same light source.

27. The movable body apparatus according to claim 26, wherein
  the reflection surface is a semi-transmissive reflection surface, and
  a light emitted from the same light source is irradiated to the reflection surface, and a transmitted light and a reflected light that are generated at the reflection surface are used as the first and second measurement lights, respectively.

28. The movable body apparatus according to claim 20, wherein
  the first and second measurement devices include a common photodetection element, and
  the common photodetection element receives a synthesized light of the diffracted light and the return light, and outputs signals corresponding to measurement results of the first and second measurement devices, based on each of an intensity and a phase of the synthesized light.

29. The movable body apparatus according to claim 20, further comprising:
  a drive device that drives the movable body; and
  a controller that controls the drive device based on a measurement result of a position measuring system that includes the first and second measurement devices.

30. The movable body apparatus according to claim 20, wherein
  the movable body also moves in an orthogonal direction to the one axial direction within the predetermined plane, and
  the movable body apparatus further comprises:
  a third measurement device that has a configuration similar to the first measurement device, and irradiates a fixed grating, which is arranged outside the movable body and has a periodic direction in the orthogonal direction, with a third measurement light along an optical path at least partially including a third optical path in the orthogonal direction, via a part of the movable body; and
  a fourth measurement device that has a configuration similar to the second measurement device, and irradiates the part of the movable body with a fourth measurement light along a fourth optical path in the orthogonal direction.

31. An exposure apparatus that forms a pattern on an object by irradiating the object with an energy beam, the apparatus comprising:
  the movable body apparatus according to claim 20, which drives a movable body that holds the object along a predetermined plane, in order to form the pattern.

32. A device manufacturing method, comprising:
  forming a pattern on an object by irradiating the object with an energy beam while the object is held on the movable body of the exposure apparatus according to claim 31; and
  developing the object on which the pattern has been formed.

33. A pattern formation apparatus that forms a pattern on an object, the apparatus comprising:
  a movable body that is movable and that holds the object;
  a pattern generating device that forms a pattern on the object; and
  the movable body apparatus according to claim 20, which drives the movable body within a predetermined plane.

34. The pattern formation apparatus according to claim 33, wherein
  the object has a sensitive layer, and
  the pattern generating device forms the pattern by irradiating the sensitive layer with an energy beam.

35. A device manufacturing method, comprising:
forming a pattern on an object by irradiating the object with an energy beam while the object is held on the movable body of the pattern formation apparatus according to claim 33; and
developing the object on which the pattern has been formed.

36. A movable body apparatus, comprising:
a movable body that moves in at least one axial direction along a predetermined plane that includes the one axial direction and a second axial direction orthogonal to the one axial direction, the movable body holding an object that extends in a plane parallel to the predetermined plane;
a first measurement device that measures positional information of the movable body in the one axial direction, by (i) irradiating a first grating of the movable body or (ii) by irradiating a first grating arranged outside the movable body via a part of the movable body, with a first measurement light along an optical path including a first optical path in the one axial direction that is headed to the movable body via an optical system, and receiving a diffracted light from the first grating; and
a second measurement device that measures positional information of the movable body in the one axial direction, by irradiating the movable body with a second measurement light via at least a part of an optical member of the optical system, along a second optical path parallel to the first optical path and receiving a return light of the second measurement light from the movable body.

37. The movable body apparatus according to claim 36, wherein
the first grating is a fixed grating that is arranged outside the movable body and has a periodic direction in the one axial direction, and
the movable body apparatus further comprises:
a second grating that is arranged on the movable body and has a periodic direction in a direction corresponding to the periodic direction of the fixed grating.

38. The movable body apparatus according to claim 37, further comprising:
a reflection surface arranged on the movable body and that reflects the second measurement light.

39. The movable body apparatus according to claim 36, wherein
the optical system has an optical branching member that generates the first measurement light and the second measurement light by branching an incident light.

40. The movable body apparatus according to claim 36, wherein
the first and second measurement lights are lights from a same light source.

41. An exposure apparatus that forms a pattern on an object by irradiating the object with an energy beam, the apparatus comprising:
movable body apparatus according to claim 36, which drives a movable body that holds the object along a predetermined plane, in order to form the pattern.

42. A device manufacturing method, comprising:
forming a pattern on an object by irradiating the object with an energy beam while the object is held on the movable body of the exposure apparatus according to claim 41; and
developing the object on which the pattern has been formed.

43. A pattern formation apparatus that forms a pattern on an object, the apparatus comprising:
a movable body that is movable and that holds the object;
a pattern generating device that forms a pattern on the object; and
the movable body apparatus according to claim 36, which drives the movable body within a predetermined plane.

44. The pattern formation apparatus according to claim 43, wherein
the object has a sensitive layer, and
the pattern generating device forms the pattern by irradiating the sensitive layer with an energy beam.

45. A device manufacturing method, comprising:
forming a pattern on an object by irradiating the object with an energy beam while the object is held on the movable body of the pattern formation apparatus according to claim 43; and
developing the object on which the pattern has been formed.

* * * * *

UNITED STATES PATENT AND TRADEMARK OFFICE
CERTIFICATE OF CORRECTION

| | |
|---|---|
| PATENT NO. | : 8,760,622 B2 |
| APPLICATION NO. | : 12/331588 |
| DATED | : June 24, 2014 |
| INVENTOR(S) | : Makinouchi |

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1259 days.

Signed and Sealed this
Eleventh Day of August, 2015

Michelle K. Lee
*Director of the United States Patent and Trademark Office*